(12) United States Patent
Hsu

(10) Patent No.: US 11,469,179 B2
(45) Date of Patent: Oct. 11, 2022

(54) WIRE INTERCONNECT STRUCTURE OF INTEGRATED CIRCUIT

(71) Applicant: ALi Corporation, Hsinchu (TW)

(72) Inventor: Siao-Ren Hsu, Taipei (TW)

(73) Assignee: ALi Corporation, Hsinchu (TW)

( * ) Notice: Subject to any disclaimer, the term of this patent is extended or adjusted under 35 U.S.C. 154(b) by 114 days.

(21) Appl. No.: 17/075,711

(22) Filed: Oct. 21, 2020

(65) Prior Publication Data

US 2021/0167008 A1    Jun. 3, 2021

(30) Foreign Application Priority Data

Nov. 28, 2019   (CN) .......................... 201911188634.3

(51) Int. Cl.
*H01L 23/528* (2006.01)
*H01L 23/522* (2006.01)
*H01L 23/482* (2006.01)

(52) U.S. Cl.
CPC ........ *H01L 23/528* (2013.01); *H01L 23/4824* (2013.01); *H01L 23/5226* (2013.01)

(58) Field of Classification Search
CPC . H01L 21/823475; H01L 24/05; H01L 24/06; H01L 2224/05553; H01L 2224/05569; H01L 2924/00014; H01L 2924/14; H01L 23/528; H01L 27/0207; H01L 23/4824; H01L 23/5226; H01L 23/5386; H01L 23/5286

See application file for complete search history.

(56) References Cited

U.S. PATENT DOCUMENTS

| | | | |
|---|---|---|---|
| 9,972,624 | B2 | 5/2018 | Rasouli et al. |
| 2005/0121789 | A1* | 6/2005 | Madurawe ........ H01L 27/11803 257/E27.11 |
| 2016/0204085 | A1* | 7/2016 | Sekar .................. H01L 27/0922 257/621 |
| 2017/0345814 | A1* | 11/2017 | Wakui ................. H01L 29/0847 |
| 2018/0197812 | A1* | 7/2018 | Or-Bach ............. H01L 23/3677 |

* cited by examiner

*Primary Examiner* — Galina G Yushina
(74) *Attorney, Agent, or Firm* — JCIPRNET

(57) ABSTRACT

A wire interconnect structure of an integrated circuit includes a first wiring layer, a second wiring layer, a third wiring layer, first conductive via structures, second conductive via structures, and third conductive via structures. The first wiring layer includes a first wire connected to first transistors and a second wire connected to second transistors. The second wiring layer includes third wires and fourth wires that are perpendicular to the first wire and the second wire. The third wiring layer includes a fifth wire and a sixth wire that are parallel to the first wire and the second wire and respectively connected to a first contact pad and a second contact pad above. The first transistors are electrically connected to the first contact pad through the first wire, and the second transistors are electrically connected to the second contact pad through the second wire.

12 Claims, 3 Drawing Sheets

WIRE INTERCONNECT STRUCTURE OF INTEGRATED CIRCUIT

CROSS-REFERENCE TO RELATED APPLICATION

This application claims the priority benefit of Chinese patent application serial no. 201911188634.3, filed on Nov. 28, 2019. The entirety of the above-mentioned patent application is hereby incorporated by reference herein and made a part of this specification.

BACKGROUND OF THE INVENTION

Field of the Invention

The disclosure relates to a layout structure of an integrated circuit, and in particular, to a wire interconnect structure of an integrated circuit.

Description of Related Art

In recent years, as the demand for information traffic keeps growing, not only the performance requirements for a processing unit are increased, but a high-speed interface communication technology for expanding data transmission bandwidth is also needed, so as to increase a data transmission rate. A signal transmission speed is associated with current amount and coupling interference. The larger the electrical current, the higher the signal transmission speed; and the greater the coupling interference, the slower the signal transmission speed. In order to increase the signal transmission rate, a high-speed signal circuit tends to dispose more transistors than that in a low-speed signal circuit to provide larger electrical current. For example, a Serdes high-speed serial interface would use a differential pair of transmission path coupled with many transistors to transmit signals in computing devices or high-performance chips. However, in order to carry large electrical current amount transmitted from a plurality of transistors on a same wire, the wire width must be broadened to prevent the wire from burning out.

However, without changing a layout area of the wires, the increase in the width of wire will aggravate the coupling issue between the wires and reduce the signal transmission speed. Conversely, if aggravation of the coupling issue between the wires is to be avoided, the layout area must be increased. The increase in the layout area will lead to an increase in the layout cost, and the aggravated coupling issue may cause a logic conversion delay of the signal or even a conversion failure, thus greatly reducing a signal bandwidth.

SUMMARY OF THE INVENTION

In view of this, the invention provides a wire interconnect structure of an integrated circuit. The wire interconnect structure of the integrated circuit may control an electrical current path through wiring to reduce a wire width, reducing coupling and achieving a high bandwidth effect.

According to an embodiment of the invention, through the wire interconnect structure of the integrated circuit, a plurality of first transistors is respectively electrically connected to a first contact pad, and a plurality of second transistors is electrically connected to a second contact pad. The wire interconnect structure includes a first wiring layer, a second wiring layer, a third wiring layer, a plurality of first conductive via structures, a plurality of second conductive via structures and a plurality of third conductive via structures. The first wiring layer is located on the first transistor and the second transistor. The first wiring layer includes at least one first wire and at least one second wire that cross over the first transistor and the second transistor. The first wire is connected to the first transistor, and the second wire is connected to the second transistor. The second wiring layer is located above the first wiring layer and below the first contact pad and the second contact pad. The second wiring layer includes a plurality of third wires and a plurality of fourth wires that is perpendicular to the first wire and the second wire. The third wiring layer is located above the second wiring layer and below the first contact pad and the second contact pad. The third wiring layer includes at least one fifth wire and at least one sixth wire. The fifth wire and the sixth wire are parallel to the first wire and the second wire. The fifth wire is connected to the first contact pad, and the sixth wire is connected to the second contact pad. The first conductive via structures are disposed between the first wiring layer and the second wiring layer, the second conductive via structures are disposed between the second wiring layer and the third wiring layer, and the third conductive via structures are disposed between the third wiring layer and the first contact pad and disposed between the third wiring layer and the second contact pad. The first wire is electrically connected to the first contact pad through some of the first conductive via structures, the third wires, some of the second conductive via structures and the fifth wire. The second wire is electrically connected to the second contact pad through others of the first conductive via structures, the fourth wires, others of the second conductive via structures and the sixth wire.

Based on the foregoing, in an embodiment of the invention, the electrical current path may be controlled through layout design to cause each wire to carry only less electrical current of the transistor. Therefore, the width of the wire may be reduced, so that the layout area may be reduced, and differential path coupling may be further reduced to prevent the lower data transmission speed, thereby achieving a high band-width effect.

DESCRIPTION OF THE EMBODIMENTS

Figure 1:
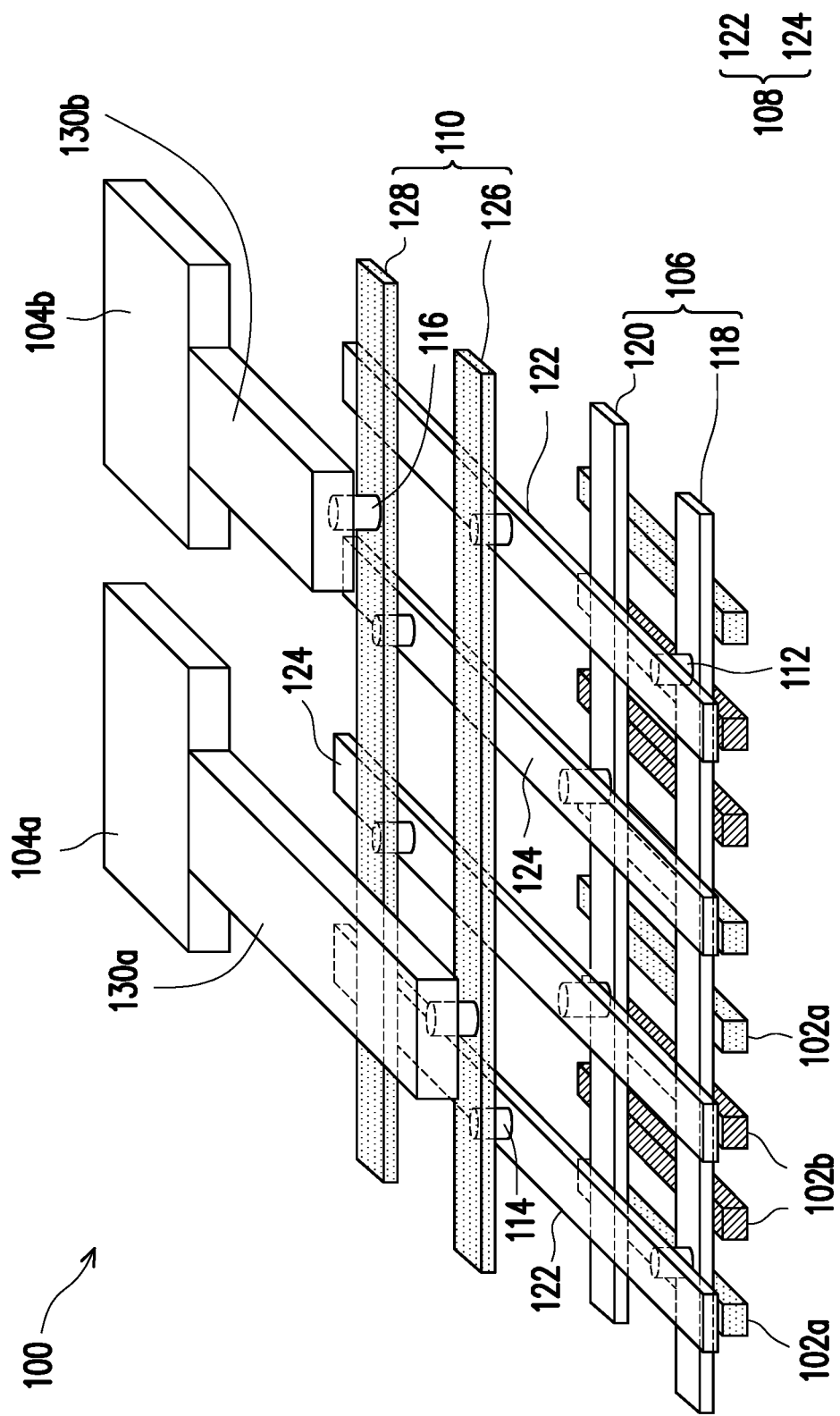
FIG. 1 is a schematic diagram of a wire interconnect structure of an integrated circuit according to a first embodiment of the invention.

Exemplary embodiments of the present invention are described in detail, and examples of the exemplary embodiments are shown in the accompanying drawings. In the accompanying drawings, the components and relative sizes thereof may not be drawn to scale for clarity. Whenever possible, the same element symbols are used in the drawings and descriptions to indicate the same or similar parts.

FIG. 1 is a schematic diagram of a wire interconnect structure of an integrated circuit according to a first embodiment of the invention.

Referring to FIG. 1, the wire interconnect structure 100 of the integrated circuit in the present embodiment respectively electrically connects a plurality of first transistors 102a to a first contact pad 104a and electrically connects a plurality of second transistors 102b to a second contact pad 104b. The plurality of first transistors 102a and the plurality of second transistors 102b may constitute elements with specific functions according to various design requirements, such as being a current mirror. The transistors are arranged along a first direction, that is, except for transistors arranged on the edge, each transistor is adjacent with other transistors on both sides along the first direction. In the present embodiment, a first transistor 102a is on one side of each of the second transistor 102b, and another second transistor 102b is on the other side of each of the second transistor 102b. In this case, in the present embodiment, a second transistor 102b is also on one side of each of the first transistors 102a, and another first transistor 102a is on the other side of each of the first transistors 102a. In the present embodiment, quantities and types of the first transistors 102a are the same as those of the second transistors 102b, and the electrical current amount transmitted by the first transistors 102a are the same as electrical current amount transmitted by the second transistor 102b, but the invention is not limited thereto. The wire interconnect structure 100 includes a first wiring layer 106, a second wiring layer 108, a third wiring layer 110, a plurality of first conductive via structures 112, a plurality of second conductive via structures 114 and a plurality of third conductive via structures 116.

The first wiring layer 106 is located above the first transistor 102a and the second transistor 102b. The first wiring layer 106 includes at least one first wire 118 and at least one second wire 120 that both cross over the first transistor 102a and the second transistor 102b. In other words, like the transistor, the first wire 118 and the second wire 120 extend along a first direction. The first wire 118 may be connected to a plurality of first transistors 102a through a plurality of contacts (not shown), and the second wire 120 may be connected to a plurality of second transistors 102b through a plurality of different contacts (not shown).

Still referring to FIG. 1, the second wiring layer 108 is located above the first wiring layer 106 and below the first contact pad 104a and the second contact pad 104b. The second wiring layer 108 includes a plurality of third wires 122 and a plurality of fourth wires 124 that extends along a second direction. The second direction is perpendicular to the first direction. In other words, the third wires 122 and the fourth wires 124 of the second wiring layer 108 are perpendicular to the first wire 118 and the second wire 120 of the first wiring layer 106. Each of the third wires 122 and each of the fourth wires 124 may be located between two neighbouring first transistors 102a and/or second transistors 102b, or be above and align with one of the first transistors 102a or the second transistors 102b. On two sides of each fourth wire 124, one third wire 122 and another fourth wire 124 are respectively disposed. Similarly, on two sides of each third wire 122, one fourth wire 124 and another third wire 122 are respectively disposed. The plurality of first conductive via structures 112 is disposed between the first wiring layer 106 and the second wiring layer 108, so that each third wire 122 is connected to the first wire 118 through some of the plurality of first conductive via structures 112, and each fourth wire 124 is connected to the second wire 120 through others of the plurality of first conductive via structures 112. In addition, the sum of the quantities of the third wires 122 and the fourth wires 124 may be a half of the sum of the quantities of the first transistors 102a and the second transistors 102b that are crossed over by the first wire 118. For example, when the total number of the first transistors 102a and the second transistors 102b is 16, the total number of the third wires 122 and the fourth wires 124 may be 8. Further, the quantity of the third wires 122 is equal to the quantity of the fourth wires 124, that is, 4, in the instance. However, the invention is not limited thereto. In another embodiment, the sum of the quantities of the third wires 122 and the fourth wires 124 may be further between four and the sum of the quantities of the first transistors 102a and the second transistors 102b.

In FIG. 1, the third wiring layer 110 is located above the second wiring layer 108 and below both the first contact pad 104a and the second contact pad 104b. The third wiring layer 110 includes at least one fifth wire 126 and at least one sixth wire 128 that are parallel to the first direction, that is, the fifth wire 126 and the sixth wire 128 are parallel to the first wire 118 and the second wire 120. The plurality of second conductive via structures 114 is disposed between the second wiring layer 108 and the third wiring layer 110, so that the third wires 122 are connected to the fifth wire 126 through some of the plurality of second conductive via structure 114, and the fourth wires 124 are connected to the sixth wire 128 through others of the plurality of second conductive via structures 114.

The plurality of third conductive via structures 116 is disposed between the third wiring layer 110 and the first contact pad 104a, and between the third wiring layer 110 and the second contact pad 104b, so that the first contact pad 104a is connected to the fifth wire 126 through one of the third conductive via structures 116, and the second contact pad 104 is connected to the sixth wire 128 through another one of the third conductive via structures 116. In the present embodiment, the first contact pad 104a is connected, through at least one first extension wire 130a, onto the one of the third conductive via structures 116 that is connected to the fifth wire 126, and the second contact pad 104b is connected, through at least one second extension wire 130b, onto the another one of the third conductive via structures 116 that is connected to the sixth wire 128. However, the invention is not limited thereto. In another embodiment, the first contact pad 104a may directly contact with the one of the third conductive via structures 116, and the second contact pad 104b may also directly contact with the another one of the third conductive via structures 116.

Therefore, the first wire 118 electrically connected to the plurality of first transistors 102a may be electrically connected to the first contact pad 104a through some of the first conductive via structures 112, the third wires 122, some of the second conductive via structures 114 and the fifth wire 126 to form a first path for a differential signal. Similarly, the second wire 120 electrically connected to the plurality of second transistors 102b may be electrically connected to the second contact pad 104b through others of the first conductive via structures 112, the fourth wires 124, others of the second conductive via structures 114 and the sixth wire 128 to form a second path for the differential signal.

It is worth mentioning that the first wire 118 and the second wire 120 may be configured as multilayer structures based on the embodiment of FIG. 1. The multilayer structure includes, for example, a plurality of intermediate wiring layers (not shown) between the first wiring layer 106 and the second wiring layer 108. Each of the intermediate wiring layers also includes at least one first wire and at least one second wire that are configured the same as the first wiring layer 106, and a plurality of intermediate conductive via structures (not shown) may be disposed between adjacent intermediate wiring layers to connect wires among the multilayer intermediate wiring layers. In addition, the plurality of third wires 122 and the plurality of fourth wires 124 may also be configured as multilayer structure. The multilayer structure further includes, for example, a plurality of intermediate wiring layers (not shown) between the second wiring layer 108 and the third wiring layer 110, and the intermediate layers between the second wiring layer 108 and the third wiring layer 110 also respectively include a plurality of third wires 122 and a plurality of fourth wires 124 that is configured the same as the second wiring layer 108. A plurality of intermediate conductive via structures (not shown) may be disposed between the plurality of intermediate wiring layers, so that the plurality of intermediate wiring layers of the third wires may be interconnected and conducted with each other, and the plurality of intermediate wiring layers of the fourth wires may be interconnected and conducted with each other.

According to the present embodiment, the wire interconnect structure may disperse electrical current paths, so that the electrical current can be minimized from multiple transistors through each wire (the first wire 118 and the second wire 120) in the first wiring layer 106. In the embodiment shown in FIG. 1, any third wire 122 or any fourth wire 124 of the second wiring layer 108 is located between two transistors. When the first transistor 102a transmits electrical current on the first path, the electrical current flows into the closest third wire 122 through the first wire 118. Therefore, each first transistor 102a transmits, on the first wire 118, the electric current toward different directions to a closest third wire 122 other than flowing into a same third wire 122, thereby dispersing electrical current amount to be carried on the first wire 118. Accordingly, the wire interconnect structure 100 disclosed in the present embodiment does not need to greatly broaden the width of the first wire 118 to respond to more electrical current transmitted by the plurality of first transistors 102a, which also applies to the second wire 120. In other words, compared to conventional method that increases wire widths to carry the electrical current amount transmitted by multiple transistors, the method in the present embodiment may carry the same amount of electrical current while greatly reducing the wire width, decreasing the layout area, and reducing differential path coupling that affects data transmission rate, thereby achieving a high bandwidth transmission.

Figure 2:
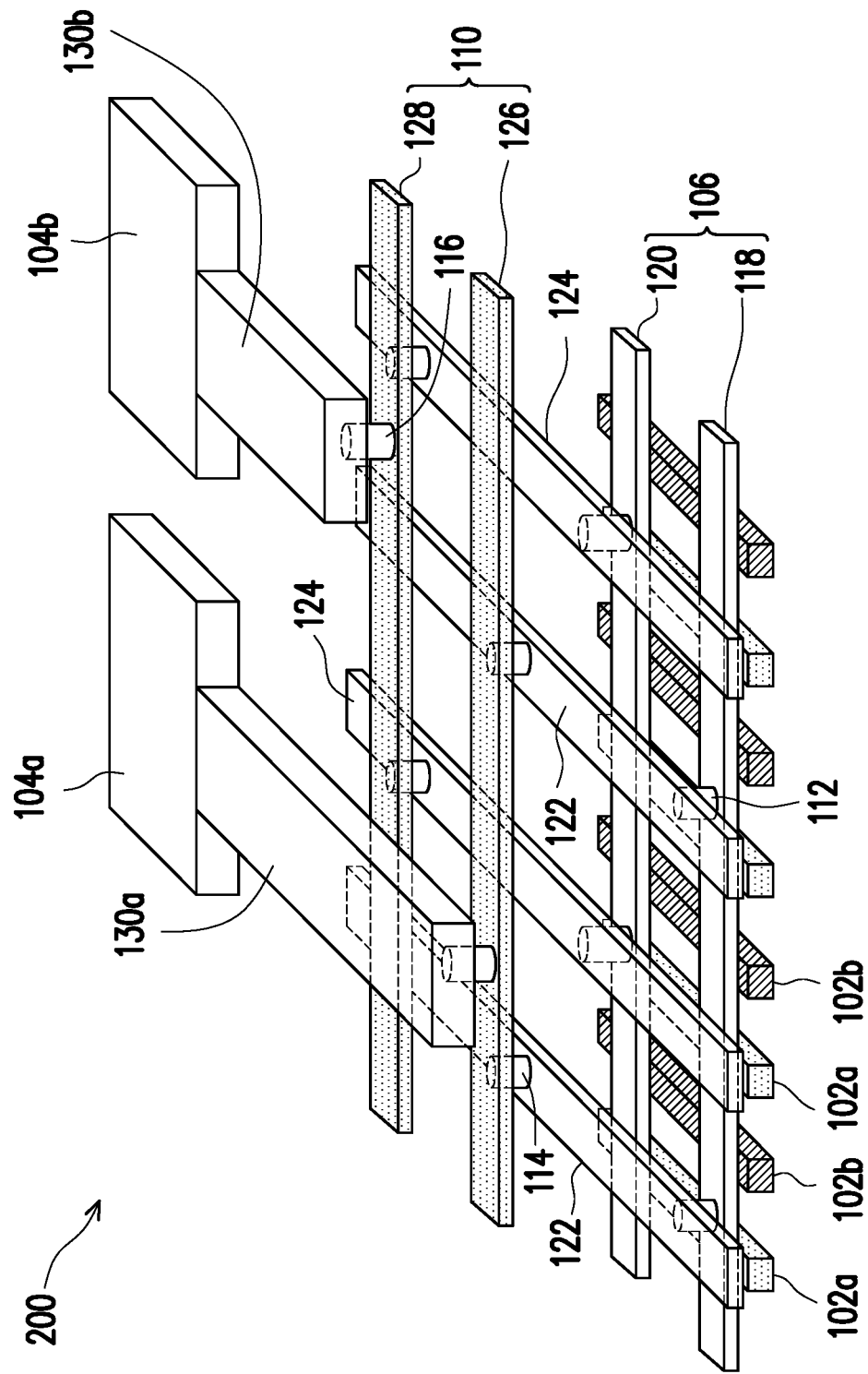
FIG. 2 is a schematic diagram of a wire interconnect structure of an integrated circuit according to a second embodiment of the invention.

FIG. 2 is a schematic diagram of a wire interconnect structure of an integrated circuit according to a second embodiment of the invention. A same or similar reference numeral as a reference numeral used in the first embodiment indicates a same or similar component, and a material, a process, and an effect of the component are described in detail in the foregoing embodiment, and the descriptions thereof are omitted herein.

Referring to FIG. 2, a difference between the wire interconnect structure 200 of the integrated circuit in the present embodiment and the wire interconnect structure of the integrated circuit in first embodiment is that first transistors 102a and second transistors 102b are alternately arranged, and third wires 122 and fourth wires 124 are also alternately arranged. In other words, the second transistors 102b are disposed on two sides of each first transistor 102a, and the first transistors 102a are disposed on two sides of each second transistor 102b. Similarly, the fourth wires 124 are disposed on two sides of each third wire 122, and the third wires 122 are disposed on two sides of each fourth wire 124. Positions of the first conductive via structures 112 and the second conductive via structures 114 are also correspondingly adjusted. Therefore, the third wires 122 of the wire interconnect structure 200 in the second embodiment may be connected to the first wire 118 through some of the first conductive via structures 112 and connected to a fifth wire 126 through some of the second conductive via structures 114, and the fourth wires 124 may be connected to the second wire 120 through others of the first conductive via structures 112, and connected to a sixth wire 128 through others of the second conductive via structures 114. By controlling the electrical current paths, the electrical current can be minimized from multiple transistors through each wire (the first wire 118 and the second wire 120) in the first wiring layer 106, greatly reducing the wire width, thereby reducing the layout area and increasing the density of integrated circuits.

Figure 3:
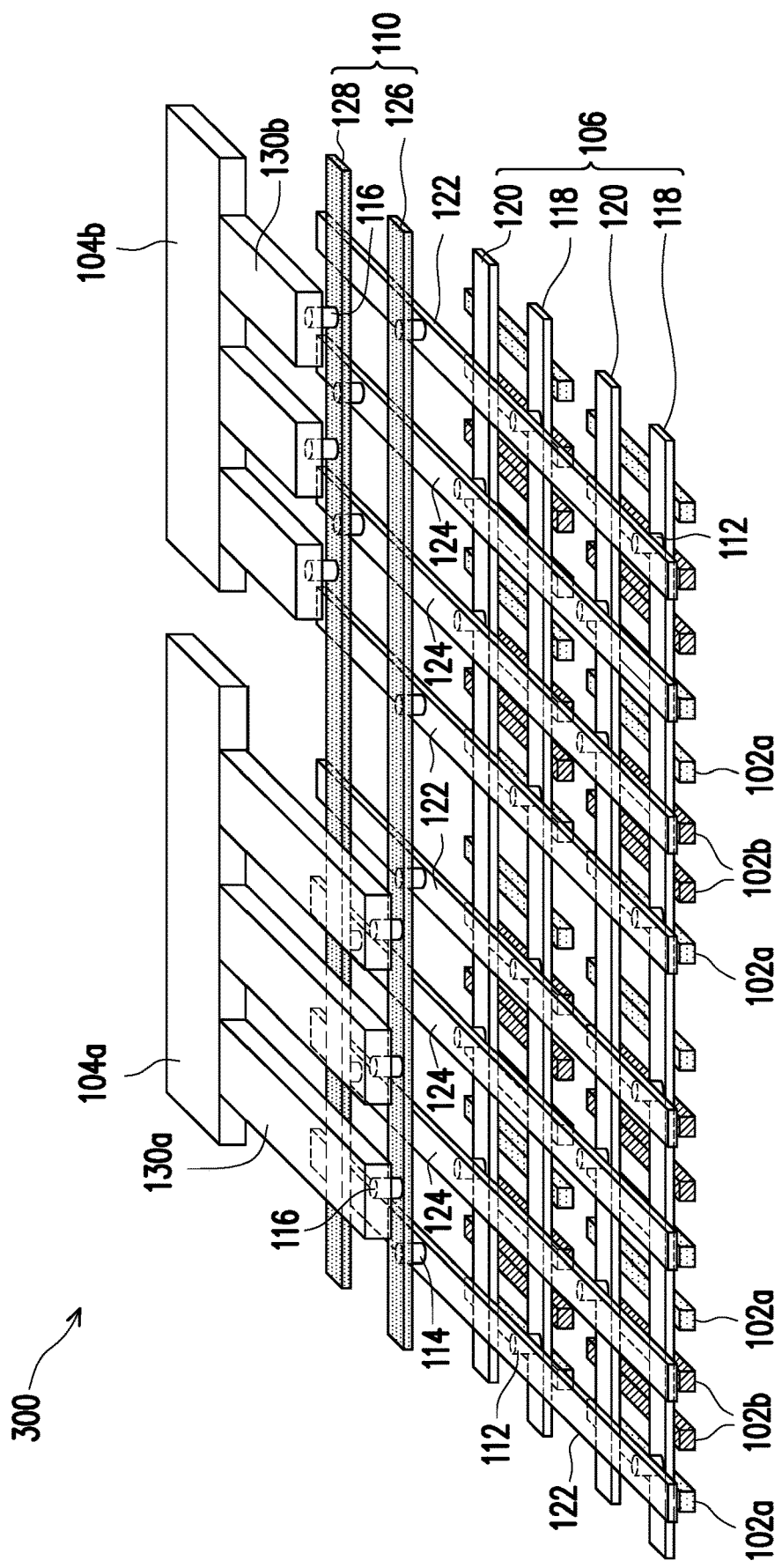
FIG. 3 is a schematic diagram of a wire interconnect structure of an integrated circuit according to a third embodiment of the invention.

FIG. 3 is a schematic diagram of a wire interconnect structure of an integrated circuit according to a third embodiment of the invention. A same or similar reference numeral as a reference numeral used in the first embodiment indicates a same or similar component, and a material, a process and an effect of the component are described in detail in the foregoing embodiment, and the descriptions thereof are omitted herein.

Referring to FIG. 3, a difference between a wire interconnect structure 300 of an integrated circuit in the present embodiment and the wire interconnect structure of the integrated circuit in the first embodiment is that the first transistor 102a and the second transistor 102b are arranged in a row. For example, two rows of a plurality of first transistors 102a and a plurality of second transistors 102b are arranged in a same order. Therefore, a first wiring layer 106 connected to the first transistor 102a and the second transistor 102b is also correspondingly changed to include two first wires 118 and two second wires 120. In addition, the quantity of first extension wires 130a is changed to be several, namely, three in the present embodiment, and the quantity of the second extension wire 130b is also changed to three. A first contact pad 104a is connected, through the three first extension wires 130a, onto three third conductive via structures 116 that are connected to a fifth wire 126, and a second contact pad 104b is connected, through the three second extension wires 130b, onto other three third conductive via structures 116 that are connected to a sixth wire 128. However, the invention is not limited thereto. The quantity of the first extension wires 130a and the second extension wires 130b in the present embodiment may be also respectively changed to be two, provided that the electrical current can be dispersed; that is, an intermediate first extension wire 130a of the three first extending wire 130a in FIG. 3 is omitted, and an intermediate second extension wire 130b of the three second extension wire 130b in FIG. 3 is omitted. In the present embodiment, with the electrical current path design, each wire (a first wire 118 and a second wire 120) in the first wiring layer 106 similarly only needs to carry less electrical current from multiple transistors, so as to greatly reduce the wire width and decrease the layout area.

Based on the foregoing, according to the layout design of the invention, the electrical current path can be controlled, to reduce the width of the original single-layer wire, reducing coupling and thereby achieving a high bandwidth transmission.

Finally, it should be noted that the foregoing embodiments are merely used for describing the technical solutions of the invention, but are not intended to limit the invention. Although the invention is described in detail with reference to the foregoing embodiments, a person of ordinary skill in the art should understand that, modifications may still be made to the technical solutions in the foregoing embodiments, or equivalent replacements may be made to part or all of the technical features; and these modifications or replacements will not cause the essence of corresponding technical solutions to depart from the scope of the technical solutions in the embodiments of the invention.

What is claimed is:

1. A wire interconnect structure of an integrated circuit, wherein through the wire interconnect structure, a plurality of first transistors is electrically connected to a first contact pad, and a plurality of second transistors is electrically connected to a second contact pad, the wire interconnect structure comprising:
a first wiring layer located on the plurality of first transistors and the plurality of second transistors, wherein the first wiring layer comprises at least one first wire and at least one second wire that cross over the plurality of first transistors and the plurality of second transistors, the at least one first wire is connected to the plurality of first transistors, and the at least one second wire is connected to the plurality of second transistors;
a second wiring layer located above the first wiring layer and below the first contact pad and the second contact pad, wherein the second wiring layer comprises a plurality of third wires and a plurality of fourth wires that are both perpendicular to the at least one first wire and the at least one second wire;
a third wiring layer located above the second wiring layer and below the first contact pad and the second contact pad, wherein the third wiring layer comprises at least one fifth wire and at least one sixth wire, the at least one fifth wire and the at least one sixth wire are parallel to the at least one first wire and the at least one second wire, the at least one fifth wire is connected to the first contact pad, and the at least one sixth wire is connected to the second contact pad;
a plurality of first conductive via structures disposed between the first wiring layer and the second wiring layer;
a plurality of second conductive via structures disposed between the second wiring layer and the third wiring layer; and
a plurality of third conductive via structures disposed between the third wiring layer and the first contact pad and disposed between the third wiring layer and the second contact pad, wherein
the at least one first wire is electrically connected to the first contact pad through some of the plurality of first conductive via structures, some of the plurality of third wires, some of the plurality of second conductive via structures, and the at least one fifth wire, and
the at least one second wire is electrically connected to the second contact pad through others of the plurality of first conductive via structures, some of the plurality of fourth wires, others of the plurality of second conductive via structures, and the at least one sixth wire.

2. The wire interconnect structure of the integrated circuit according to claim 1, wherein one second transistor of the plurality of second transistors is on one side of one of the plurality of first transistors, and another first transistor of the plurality of first transistors is on the other side of the one of the plurality of first transistors, and a still another first transistor of the plurality of first transistors is on one side of another second transistor of the plurality of second transistors, and a still another second transistor of the plurality of second transistors is on the other side of the another second transistor of the plurality of second transistors.

3. The wire interconnect structure of the integrated circuit according to claim 2, wherein some of the plurality of third wires are connected to the at least one first wire through some of the plurality of first conductive via structures and are connected to the at least one fifth wire through some of the plurality of second conductive via structures, and some of the plurality of fourth wires are connected to the at least one second wire through others of the plurality of first conductive via structures and are connected to the at least one sixth wire through others of the plurality of second conductive via structures, wherein one of the fourth wires is on one side of one of the third wires, and another third wire is on the other side of the one of the third wires, and a still another third wire is on one side of another one of the fourth wires, and a still another fourth wire is on the other side of the another one of the fourth wires.

4. The wire interconnect structure of the integrated circuit according to claim 1, wherein the first transistors and the second transistors are alternately arranged.

5. The wire interconnect structure of the integrated circuit according to claim 4, wherein some of the plurality of third wires are connected to the at least one first wire through some of the plurality of first conductive via structures and are connected to the at least one fifth wire through some of the plurality of second conductive via structures, some of the plurality of fourth wires are connected to the at least one second wire through others of the plurality of first conductive via structures and are connected to the at least one sixth wire through others of the plurality of second conductive via structures, and the third wires and the fourth wires are alternately arranged.

6. The wire interconnect structure of the integrated circuit according to claim 1, wherein a quantity of the plurality of first transistors is equal to a quantity of the plurality of second transistors.

7. The wire interconnect structure of the integrated circuit according to claim 1, wherein the at least one first wire, the at least one second wire, each of the third wires, and each of the fourth wires are single-layer or multi-layer structures.

8. The wire interconnect structure of the integrated circuit according to claim 1, wherein the first contact pad is connected to the at least one fifth wire through at least one of the plurality of third conductive via structures, and the second contact pad is connected to the at least one sixth wire through at least another one of the plurality of third conductive via structures.

9. The wire interconnect structure of the integrated circuit according to claim 1, wherein the plurality of first transistors and the plurality of second transistors are arranged in a row.

10. The wire interconnect structure of the integrated circuit according to claim 9, wherein the at least one first wire is one of two or more first wires, and the at least one second wire is one of two or more second wires.

11. The wire interconnect structure of the integrated circuit according to claim 1, wherein the wire interconnect structure further comprises: at least one first extension wire connecting the first contact pad onto at least one of the plurality of the third conductive via structures that is connected to the at least one fifth wire; and at least one second extension wire connecting the second contact pad onto at least another one of the plurality of the third conductive via structures that is connected to the at least one sixth wire.

12. The wire interconnect structure of the integrated circuit according to claim 1, wherein a sum of quantities of the plurality of third wires and the plurality of fourth wires is a half of a sum of quantities of the plurality of first transistors and the plurality of second transistors that are crossed over by the at least one first wire.

* * * * *